(12) United States Patent
Westerberg et al.

(10) Patent No.: US 11,942,565 B2
(45) Date of Patent: Mar. 26, 2024

(54) SOLAR CELL EMITTER REGION FABRICATION USING SUBSTRATE-LEVEL ION IMPLANTATION

(71) Applicant: Maxeon Solar Pte. Ltd., Singapore (SG)

(72) Inventors: Staffan Westerberg, Sunnyvale, CA (US); Timothy Weidman, Sunnyvale, CA (US); David D. Smith, Campbell, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 730 days.

(21) Appl. No.: 17/021,930

(22) Filed: Sep. 15, 2020

(65) Prior Publication Data

US 2020/0411711 A1 Dec. 31, 2020
US 2022/0020894 A2 Jan. 20, 2022

Related U.S. Application Data

(63) Continuation of application No. 14/672,071, filed on Mar. 27, 2015, now abandoned.

(51) Int. Cl.
*H01L 31/18* (2006.01)
*H01L 31/068* (2012.01)

(52) U.S. Cl.
CPC ...... *H01L 31/1864* (2013.01); *H01L 31/0682* (2013.01); *H01L 31/1804* (2013.01); *Y02E 10/547* (2013.01); *Y02P 70/50* (2015.11)

(58) Field of Classification Search
CPC ............. H01L 31/1864; H01L 31/0682; H01L 31/1804; H01L 31/022441; Y02E 10/547; Y02P 70/50
See application file for complete search history.

(56) References Cited

U.S. PATENT DOCUMENTS 2,695,852 A 11/1954 Sparks
3,736,425 A 5/1973 Chernow
(Continued)

FOREIGN PATENT DOCUMENTS

CN 101330047 A 12/2008
CN 102150278 8/2011
(Continued)

OTHER PUBLICATIONS

Lu, Nicky C., et al., "Modeling and Optimization of Monolithic Polycrystalline Silicon Resistors," IEEE Transactions On Electron Devices, vol. ED-28, No. 7, Jul. 1981, pp. 818-830.
(Continued)

*Primary Examiner* — Earl N Taylor
(74) *Attorney, Agent, or Firm* — Schwabe, Williamson & Wyatt, P.C.

(57) ABSTRACT

Methods of fabricating solar cell emitter regions using substrate-level ion implantation, and resulting solar cells, are described. In an example, a method of fabricating a solar cell involves forming a lightly doped region in a semiconductor substrate by ion implantation, the lightly doped region of a first conductivity type of a first concentration. The method also involves forming a first plurality of dopant regions of the first conductivity type of a second, higher, concentration by ion implantation, the first plurality of dopant regions overlapping with a first portion of the lightly doped region. The method also involves forming a second plurality of dopant regions by ion implantation, the second plurality of dopant regions having a second conductivity type of a concentration higher than the first concentration, and the second plurality of dopant regions overlapping with a second portion of the lightly doped region and alternating with but not overlapping the first plurality of dopant regions.

18 Claims, 9 Drawing Sheets

(56) References Cited

U.S. PATENT DOCUMENTS

| | | | |
|---|---|---|---|
| 3,790,412 A | 2/1974 | Moline | |
| 4,015,280 A | 3/1977 | Matsushita et al. | |
| 4,086,102 A | 4/1978 | King | |
| 4,381,956 A | 5/1983 | Lane | |
| 4,448,797 A | 5/1984 | Burnham | |
| 4,448,865 A | 5/1984 | Bohlen et al. | |
| 4,557,037 A | 12/1985 | Hanoka et al. | |
| 5,360,990 A | 11/1994 | Swanson | |
| 5,907,766 A | 5/1999 | Swanson et al. | |
| 6,087,274 A | 7/2000 | Tonucci et al. | |
| 6,335,534 B1 | 1/2002 | Suguro et al. | |
| 6,417,078 B1 | 7/2002 | Dolan et al. | |
| 6,528,361 B1 | 3/2003 | Ahn et al. | |
| 6,614,033 B2 | 9/2003 | Suguro et al. | |
| 7,094,612 B2 | 8/2006 | Shibata et al. | |
| 7,179,569 B2 | 2/2007 | Suguro et al. | |
| 7,208,381 B2 | 4/2007 | Lee | |
| 7,459,246 B2 | 12/2008 | Suguro et al. | |
| 7,468,485 B1* | 12/2008 | Swanson | H01L 31/182 |
| | | | 136/243 |
| 7,531,216 B2 | 5/2009 | Brody | |
| 7,638,438 B2 | 12/2009 | Eldershaw | |
| 7,727,866 B2 | 6/2010 | Bateman et al. | |
| 7,745,073 B2 | 6/2010 | Suguro et al. | |
| 7,816,239 B2 | 10/2010 | Blake et al. | |
| 7,820,460 B2 | 10/2010 | Sullivan et al. | |
| 7,888,249 B2 | 2/2011 | Bateman et al. | |
| 8,222,053 B2 | 7/2012 | Sullivan et al. | |
| 8,461,011 B2* | 6/2013 | Jeon | H01L 31/0682 |
| | | | 438/662 |
| 8,470,616 B2 | 6/2013 | Sullivan et al. | |
| 8,680,490 B2* | 3/2014 | Kwag | H01L 31/1804 |
| | | | 250/492.21 |
| 9,171,723 B2* | 10/2015 | Hallam | H01L 31/1804 |
| 9,401,450 B2* | 7/2016 | Weidman | H01L 31/1876 |
| 9,530,923 B2* | 12/2016 | Molesa | H01L 31/18 |
| 2002/0011590 A1* | 1/2002 | Nagashima | H01L 31/022441 |
| | | | 252/500 |
| 2004/0112426 A1 | 6/2004 | Hagino | |
| 2006/0102224 A1 | 5/2006 | Chen et al. | |
| 2007/0151598 A1 | 7/2007 | DeCeuster et al. | |
| 2007/0295381 A1 | 12/2007 | Fujil et al. | |
| 2008/0000522 A1 | 1/2008 | Johnson et al. | |
| 2008/0017243 A1 | 1/2008 | DeCeuster et al. | |
| 2008/0072953 A1 | 3/2008 | Stephens et al. | |
| 2009/0068783 A1 | 3/2009 | Borden | |
| 2009/0227061 A1 | 9/2009 | Bateman et al. | |
| 2009/0227095 A1 | 9/2009 | Bateman et al. | |
| 2009/0308439 A1* | 12/2009 | Adibi | H01L 31/022425 |
| | | | 257/E21.135 |
| 2011/0041908 A1 | 2/2011 | Harder | |
| 2011/0162703 A1 | 7/2011 | Adibi et al. | |
| 2011/0308591 A1 | 12/2011 | Yamazaki et al. | |
| 2012/0255608 A1* | 10/2012 | Yang | H01L 31/1804 |
| | | | 438/72 |
| 2012/0282732 A1* | 11/2012 | Jeon | H01L 31/0682 |
| | | | 257/E31.124 |
| 2013/0025677 A1 | 1/2013 | Miura et al. | |
| 2013/0186457 A1* | 7/2013 | Kwag | H01L 31/068 |
| | | | 118/620 |
| 2013/0269777 A1* | 10/2013 | Jin | H01L 31/1868 |
| | | | 438/57 |
| 2013/0298963 A1* | 11/2013 | Greiff | H01L 31/1808 |
| | | | 136/246 |
| 2014/0154834 A1 | 6/2014 | Bateman et al. | |
| 2015/0017793 A1* | 1/2015 | Hallam | H01L 31/1864 |
| | | | 438/540 |
| 2015/0162483 A1* | 6/2015 | Weidman | H01L 31/022441 |
| | | | 136/258 |
| 2015/0162484 A1 | 6/2015 | Weidman | |
| 2015/0270421 A1* | 9/2015 | Jeon | H01L 31/1872 |
| | | | 438/96 |
| 2015/0380599 A1* | 12/2015 | Smith | H01L 31/022441 |
| | | | 438/97 |
| 2016/0118507 A1* | 4/2016 | Straboni | H01L 31/02363 |
| | | | 438/455 |
| 2016/0380138 A1* | 12/2016 | Chung | H01L 31/068 |
| | | | 438/87 |
| 2017/0018677 A1* | 1/2017 | Le Perchec | H01L 31/068 |
| 2020/0411711 A1* | 12/2020 | Westerberg | H01L 31/1864 |
| 2022/0020894 A2* | 1/2022 | Westerberg | H01L 31/0682 |

FOREIGN PATENT DOCUMENTS

| | | |
|---|---|---|
| CN | 102760791 A | 10/2012 |
| CN | 104396024 | 3/2015 |
| CN | 107534070 B | 11/2019 |
| EP | 2218107 | 10/2016 |
| JP | 2010-161309 | 7/2010 |
| TW | 2014-03851 | 1/2014 |

OTHER PUBLICATIONS

Meier, D. L., et al. "Aluminum alloy back p-n junction dendritic web silicon solar cell," Elsevier, Solar Energy Materials & Solar Cells 65 (2001), pp. 621-627.

Nishihashi, T., et al. "Ion-graphy implanter with stencil mask," Journal of Vacuum Science & Technology B20, 914 (2002); doi: 10.1116/1.1475982, 5 pgs.

Wang, Qi, et al., "Combinatorial synthesis of solid state electronic materials for renewable energy applications," Elsevier, Applied Surface Science 189 (2002), pp. 271-276.

Rusop, M., et al., "Photoelectrical properties of pulsed laser deposited boron doped p-carbon/n-silicon and phosphorus doped n-carbon/p-silicon heterojunction solar cells," Elsevier, Solar Energy 78 (2005) pp. 406-415.

Tonari, Kazuhiko, et al., "Stencil mask Ion Implantation Technology for realistic approach to wafer process," AIP Conference Proceedings 866, 401 (2006); doi; 10.1063/1.2401541, 5 pgs.

U.S. Appl. No. 14/320,438, filed Jun. 30, 2014, entitled "Solar Cell Emitter Region Fabrication Using Ion Implantation", 43 pgs.

International Search Report and Written Opinion for Patent Application No. PCT/US2016/023640 dated Aug. 23, 2016, 16 pgs.

First Action Interview Pre-Interview Communication from U.S. Appl. No. 14/672,071 dated May 16, 2017, 10 pgs.

First Action Interview Office Action from U.S. Appl. No. 14/672,071 dated Jul. 31, 2017, 5 pgs.

International Preliminary Report on Patentability from PCT/US2016/023640 dated Oct. 12, 2017, 12 pgs.

Final Office Action from U.S. Appl. No. 14/672,071 dated Feb. 21, 2018, 15 pgs.

Non-Final Office Action from U.S. Appl. No. 14/672,071 dated Sep. 24, 2018, 19 pgs.

First Office Action for Chinese Patent Application No. 2016800247478; dated Nov. 29, 2018; 10 pgs.

Final Office Action from U.S. Appl. No. 14/672,071 dated Apr. 8, 2019, 13 pgs.

Second Office Action for Chinese Patent Application No. 2016800247478; dated Apr. 28, 2019; 8 pgs.

Non-Final Office Action from U.S. Appl. No. 14/672,071 dated Sep. 4, 2019, 13 pgs.

Office Action from Taiwan Patent Application No. 105108843 dated Dec. 5, 2019, 11 pgs.

Final Office Action from U.S. Appl. No. 14/672,071 dated Mar. 16, 2020, 17 pgs.

Office Action issued from Taiwan Patent Application No. 105108843 dated Apr. 27, 2020, 4 pgs.

First Office Action from Chinese Patent Application No. 201911000522.0 dated Jul. 21, 2022, 13 pgs.

Notification of Provisional Rejection from Korean Patent Application No. 10-2017-7031170 dated Nov. 11, 2022, 14 pgs.

\* cited by examiner

SOLAR CELL EMITTER REGION FABRICATION USING SUBSTRATE-LEVEL ION IMPLANTATION

CROSS-REFERENCE TO RELATED APPLICATIONS

This application is a continuation of U.S. patent application Ser. No. 14/672,071, filed on Mar. 27, 2015, the entire contents of which are hereby incorporated by reference herein.

TECHNICAL FIELD

Embodiments of the present disclosure are in the field of renewable energy and, in particular, methods of fabricating solar cell emitter regions using substrate-level ion implantation, and the resulting solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

BRIEF DESCRIPTION OF THE DRAWINGS

FIGS. 1A-1F illustrate cross-sectional views of various stages in the fabrication of a solar cell, in accordance with an embodiment of the present disclosure, wherein:

FIGS. 4A-4C illustrate cross-sectional views of various stages in the fabrication of a solar cell, in accordance with an embodiment of the present disclosure, wherein:

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Methods of fabricating solar cell emitter regions using substrate-level ion implantation, and the resulting solar cells, are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as lithography and patterning techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating a solar cell involves forming a lightly doped region in a semiconductor substrate by ion implantation, the lightly doped region of a first conductivity type of a first concentration. The method also involves forming a first plurality of dopant regions of the first conductivity type of a second, higher, concentration by ion implantation, the first plurality of dopant regions overlapping with a first portion of the lightly doped region. The method also involves forming a second plurality of dopant regions by ion implantation, the second plurality of dopant regions having a second conductivity type of a concentration higher than the first concentration, and the second plurality of dopant regions overlapping with a second portion of the lightly doped region and alternating with but not overlapping the first plurality of dopant regions.

Also disclosed herein are solar cells. In one embodiment, a solar cell includes a semiconductor substrate having a light-receiving surface and a back surface opposite the light-receiving surface. A blanket dopant region is disposed in the semiconductor substrate at the back surface of the semiconductor substrate. The blanket dopant region is of a first conductivity type of a first concentration. A first plurality of dopant regions is disposed in the semiconductor substrate and is overlapping with the blanket dopant region. The first plurality of dopant regions is of the first conductivity type and of a second, higher, concentration. A second plurality of dopant regions is disposed in the semiconductor substrate and is overlapping with the blanket dopant region but alternating with and not overlapping the first plurality of dopant regions. The second plurality of dopant regions is of a second conductivity type of a concentration higher than the first concentration. A first plurality of contacts is electrically connected to the first plurality of dopant regions at the back surface of the solar cell. A second plurality of contacts is electrically connected to the second plurality of dopant regions at the back surface of the solar cell.

In another embodiment, a solar cell includes a semiconductor substrate having a light-receiving surface and a back surface opposite the light-receiving surface. A patterned dopant region is disposed in the semiconductor substrate at the back surface of the semiconductor substrate. The patterned dopant region is of a first conductivity type of a first concentration. A first plurality of dopant regions is disposed in the semiconductor substrate and is contacting at least a portion of the patterned dopant region. The first plurality of dopant regions is of the first conductivity type of a second, higher, concentration. A second plurality of dopant regions is disposed in the semiconductor substrate and is contacting at least a portion of the patterned dopant region. The second plurality of dopant regions is alternating with and not overlapping the first plurality of dopant regions. The second plurality of dopant regions is of a second conductivity type of a concentration higher than the first concentration. A first plurality of contacts is electrically connected to the first plurality of dopant regions at the back surface of the solar cell. A second plurality of contacts is electrically connected to the second plurality of dopant regions at the back surface of the solar cell.

One or more embodiments described herein provides a simplified process flow for fabricating high efficiency, all back-contact solar cell devices involving the use of ion implant technology for generating one or both of N+ (e.g., typically phosphorous or arsenic doped) and P+ (e.g., typically boron doped) diffusion regions in a substrate. In one embodiment, a fabrication approach involves the use of ion implantation to introduce atoms of the required dopant type.

To provide context, it is advantageous to seek out applications for implant technologies for solar cell fabrication. If implant technologies can be incorporated in to a manufacturing scheme, cost savings may be realized as other more expensive processing approaches are replaced with such technologies. Addressing such issues, in accordance with an embodiment of the present disclosure, approaches for solar cell fabrication described herein involve implanting of a solar cell substrate directly.

In some embodiments described herein, an implant and anneal process for back end emitter fabrication is combined with front surface layer fabrication to provide "hybrid" front surface solutions. In an exemplary embodiment, a thin layer of N-type amorphous silicon (a-Si) deposited on a front or light-receiving surface of the solar cell using, e.g., plasma enhanced chemical vapor deposition (PECVD). During the implant anneal used post implant processing on the back side of the solar cell (e.g., typically a so-called back end process), the front surface a-Si layer is crystallized to form a polycrystalline silicon layer. Other layers such as a silicon nitride (SiN) anti-reflective coating (ARC) layer or film stack may then be incorporated on the polycrystalline silicon layer on the front side of the cell. In one embodiment, the resulting front surface provides a large improvement over state of the art technologies that typically involve heavy front side doping. For example, the resulting front surface may exhibit improved ultra-violet (UV) performance.

Perhaps more generally, although front side synergies may be achieved, it is to be appreciated that embodiments need not include such front side synergies. In an embodiment, direct substrate implantation for back side processing is implemented to provide one dimensional (1D) lines at varying dopant levels. That is, embodiments described herein involve the use of back side implantation, e.g., for 1D emitter fabrication based on implanted diffusion regions of a bulk semiconductor substrate.

In an exemplary process flow using substrate-level ion implantation, FIGS. 1A-1F illustrate cross-sectional views of various stages in the fabrication of a solar cell, in accordance with an embodiment of the present disclosure. FIG. 2 is a flowchart 200 listing operations in a method of fabricating a solar cell as corresponding to FIGS. 1A-1F, in accordance with an embodiment of the present disclosure.

Figure 1A:
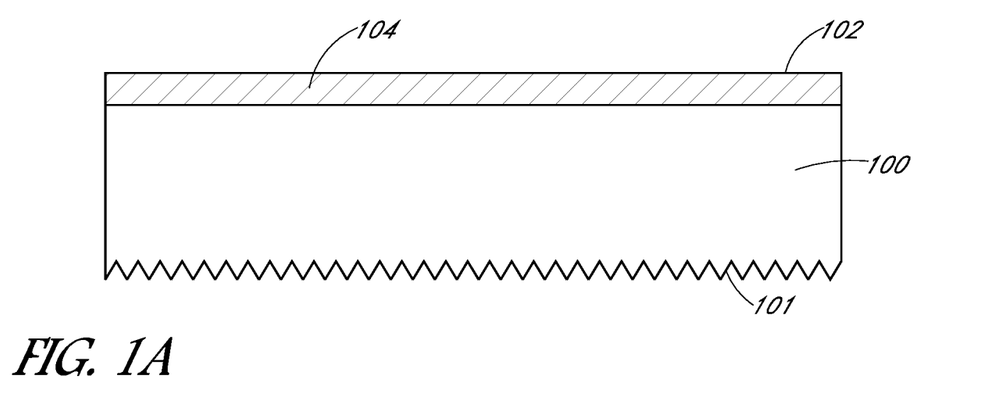
FIG. 1A illustrates a cross-sectional view following formation of a lightly doped region in a semiconductor substrate by ion implantation.
Figure 2:
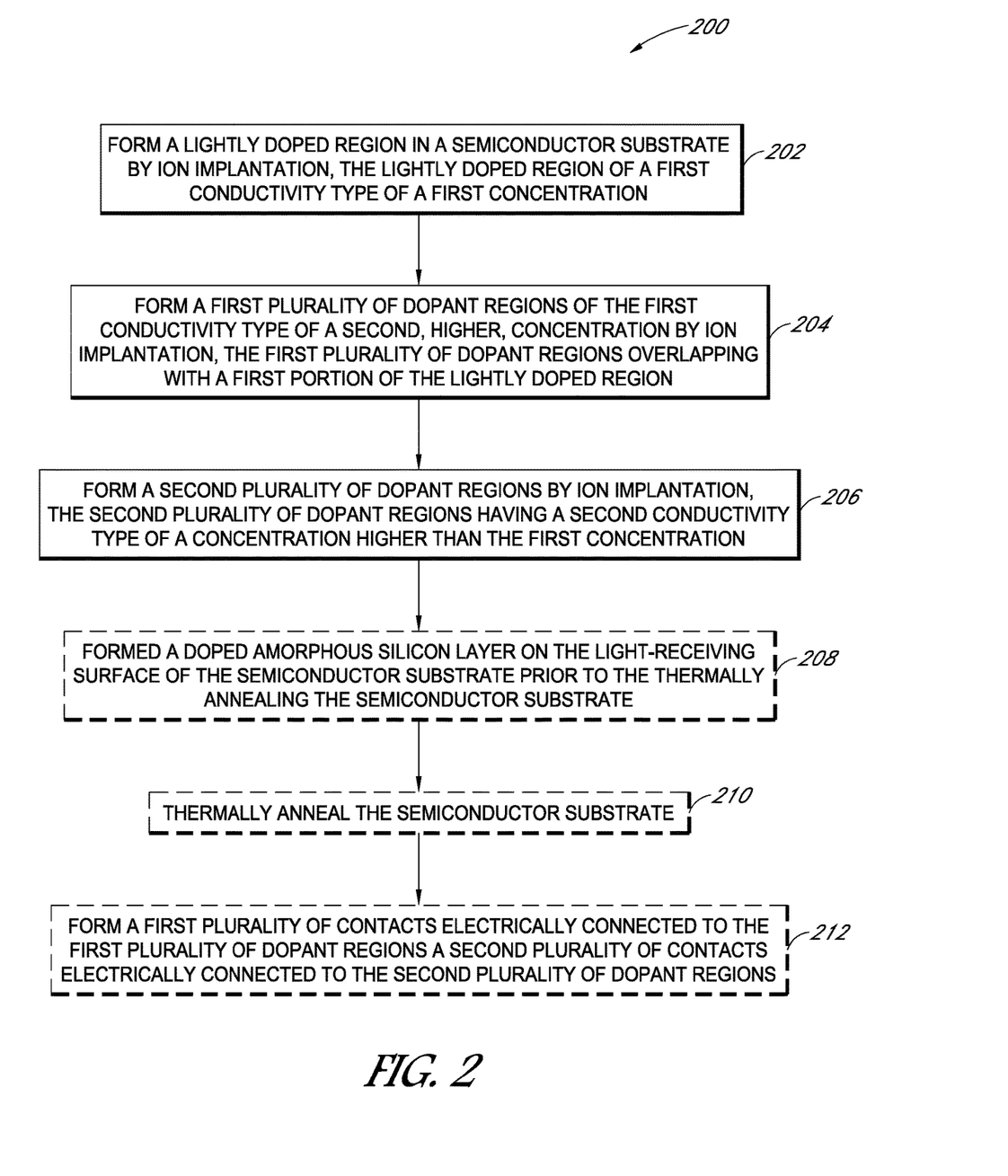
FIG. 2 is a flowchart listing operations in a method of fabricating a solar cell as corresponding to FIGS. 1A-1F, in accordance with an embodiment of the present disclosure.

Referring to FIG. 1A and corresponding operation 202 of flowchart 200, the method of fabricating a solar cell involves forming a lightly doped region 104 in a semiconductor substrate 100 by ion implantation. The lightly doped region is of a first conductivity type of a first concentration.

In an embodiment, the semiconductor substrate 100 is a monocrystalline silicon substrate, such as a bulk single crystalline N-type doped silicon substrate. It is to be appreciated, however, that semiconductor substrate 100 may be a layer, such as a multi-crystalline silicon layer, disposed on a global solar cell substrate. In an embodiment, semiconductor substrate 100 has light-receiving surface 101 opposite a back surface 102, and may be used to ultimately fabricate a back contact solar cell.

In an embodiment, the lightly doped region 104 is a blanket (non-patterned) lightly doped region formed in the semiconductor substrate 100, as is depicted in FIG. 1A. In an embodiment, the lightly doped region 104 is formed by implanting dopants during a pass under a stationary mask in an implanter.

In an embodiment, the first concentration of the first conductivity type is approximately 1E18 atoms/cm$^3$. In one embodiment, the first conductivity type is P-type, and boron atoms are implanted to form the lightly doped region 104. In another embodiment, the first conductivity type is N-type, and phosphorous atoms are implanted to form the lightly doped region 104. In an embodiment, the implanting is performed by using ion beam implantation or plasma immersion implantation.

Referring again to FIG. 1A, in an embodiment, as shown, the light receiving surface 101 of the substrate 100 is texturized. A texturized surface may be one which has a regular or an irregular shaped surface for scattering incoming light, decreasing the amount of light reflected off of the light-receiving surfaces of the solar cell. In one embodiment, the light-receiving surface 101 is texturized using a hydroxide-based wet etchant.

Figure 1B:
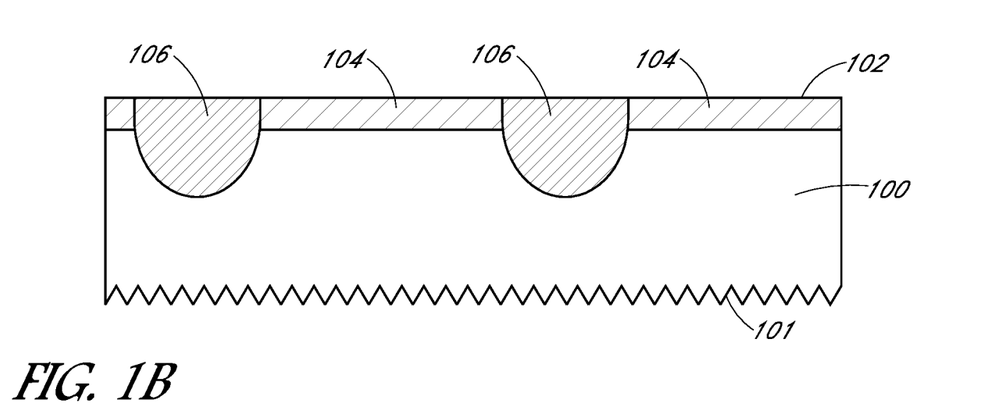
FIG. 1B illustrates a cross-sectional view of the structure of FIG. 1A following formation of a first plurality of dopant regions of the first conductivity type by ion implantation.

Referring to FIG. 1B and corresponding operation 204 of flowchart 200, the method of fabricating a solar cell further involves forming a first plurality of dopant regions 106 of the first conductivity type by ion implantation. The first plurality of dopant regions 106 of the first conductivity type is of a second, higher, concentration than lightly doped region 104. The first plurality of dopant regions 106 is overlapping with first portions of the lightly doped region 104.

In an embodiment, the first plurality of dopant regions 106 is formed by implanting dopants during a pass under a stationary mask in an implanter. In an embodiment, the second, higher, concentration of the first conductivity type is approximately 1E19 atoms/cm$^3$. In one embodiment, the first conductivity type is P-type, and boron atoms are implanted to form the first plurality of dopant regions 106. In another embodiment, the first conductivity type is N-type, and phosphorous atoms are implanted to form the first plurality of dopant regions 106. In an embodiment, the implanting is performed by using ion beam implantation or plasma immersion implantation.

In an embodiment, the lightly doped region 104 and the first plurality of dopant regions 106 are both formed by implanting dopants during a single pass under a stationary mask in an implanter, the single pass forming both the lightly doped region 104 and the first plurality of dopant regions 106. In one such embodiment, implanting of the dopants of the first conductivity type during the single pass under the stationary mask is performed using a mask having a slit pattern for forming the first plurality of dopant regions 106 and a full opening for forming the lightly doped region 104. An example of such a mask is described in greater detail below in association with FIG. 3B.

Figure 1C:
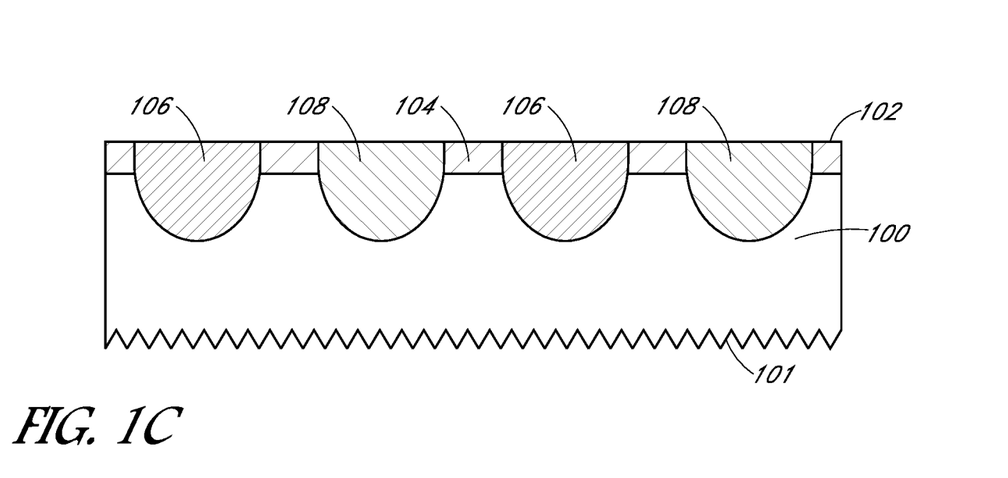
FIG. 1C illustrates a cross-sectional view of the structure of FIG. 1B following formation of a second plurality of dopant regions by ion implantation.

Referring to FIG. 1C and corresponding operation 206 of flowchart 200, the method of fabricating a solar cell further involves forming a second plurality of dopant regions 108 by ion implantation. The second plurality of dopant regions 108 is of a second, opposite, conductivity type as compared to the first conductivity type. Also, the second plurality of dopant regions 108 is of a concentration higher than the concentration of the first plurality of dopant regions 106.

The second plurality of dopant regions 108 is overlapping with second portions of the lightly doped region 104 and is alternating with, but not overlapping, the first plurality of dopant regions 106.

In an embodiment, the second plurality of dopant regions 108 is formed by implanting dopants during a pass under a stationary mask in an implanter. In an embodiment, the concentration of the second conductivity type is approximately 1E19 atoms/cm$^3$. In one embodiment, the second conductivity type is N-type, and phosphorous atoms are implanted to form the second plurality of dopant regions 108. In another embodiment, the second conductivity type is P-type, and boron atoms are implanted to form the second plurality of dopant regions 108.

It is to be appreciated that since the second plurality of dopant regions 108 is formed as overlapping the lightly doped region 104 of the first conductivity type, in an embodiment, the concentration of second conductivity type dopants is sufficient to change the conductivity type from the first to the second conductivity type in the locations of the second plurality of dopant regions 108. In an embodiment, the implanting is performed by using ion beam implantation or plasma immersion implantation.

Figure 1D:
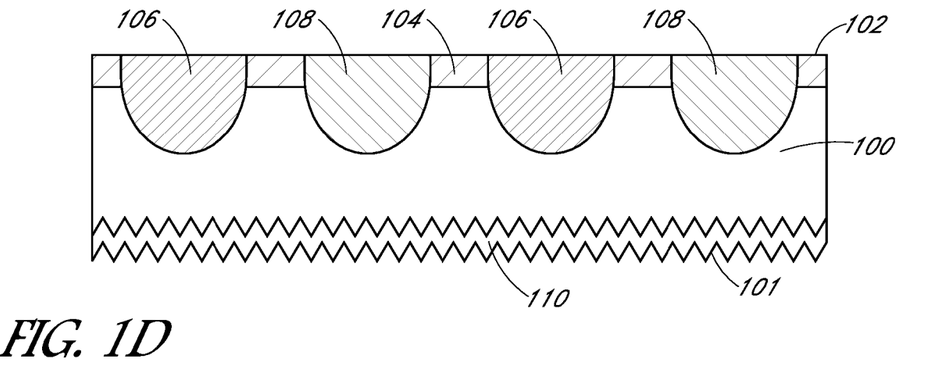
FIG. 1D illustrates a cross-sectional view of the structure of FIG. 1C following formation of a doped amorphous silicon layer on the light-receiving surface of the semiconductor substrate.

Referring to FIG. 1D and corresponding optional operation 208 of flowchart 200, the method of fabricating a solar cell further involves forming a doped amorphous silicon layer 110 on the light-receiving surface 101 of the semiconductor substrate 100. In one such embodiment, the lightly doped region 104, the first plurality of dopant regions 106, and the second plurality of dopant regions 108 are formed in the back surface 102 of the semiconductor substrate 100, the back surface opposite the light-receiving surface 101 of the semiconductor substrate 100, as is depicted in FIG. 1D.

In an embodiment, the doped amorphous silicon layer 110 is formed using plasma enhanced chemical vapor deposition (PECVD) or low pressure chemical vapor deposition (LPCVD). In one such embodiment, the doped amorphous silicon layer 110 is an N-type doped amorphous silicon layer formed using PECVD. It is to be appreciated that, although represented as being formed following the above described implant processes (operations 202, 204, 206), the doped amorphous silicon layer 110 may be formed on the light-receiving prior to any or all of the implant operations. It is also to be appreciated that although not depicted, in an embodiment, the doped amorphous silicon layer 110 is formed on a thin tunneling dielectric layer first formed on the light-receiving surface of the semiconductor substrate. In one such embodiment, the thin tunneling dielectric layer has a thickness approximately in the range of 10-150 Angstroms. In a particular such embodiment, the thin tunneling dielectric layer is a layer of silicon oxide having a thickness approximately in the range of 15-20 Angstroms.

Figure 1E:
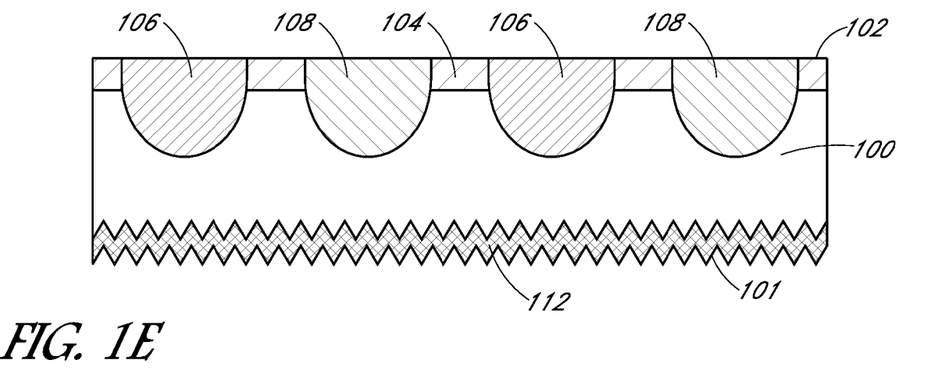
FIG. 1E illustrates a cross-sectional view of the structure of FIG. 1D following thermally annealing of the semiconductor substrate.

Referring to FIG. 1E and corresponding optional operation 210 of flowchart 200, the method of fabricating a solar cell further involves thermally annealing the semiconductor substrate subsequent to the ion implantation operations described in association with FIGS. 1A-1C.

In an embodiment, the thermal anneal is performed in a substantially nitrogen (N$_2$) atmosphere. In an embodiment, the annealing is performed at a temperature approximately in the range of 850-1100 degrees Celsius for a duration approximately in the range of 1-100 minutes.

Referring again to FIG. 1E, in an embodiment where a doped amorphous silicon layer 110 is formed on the light-receiving surface 101 of the semiconductor substrate 100, the thermal anneal crystallizes the doped amorphous silicon layer 110 to form a doped polycrystalline silicon layer 112 on the light-receiving surface 101 of the semiconductor substrate 100, as is depicted in FIG. 1E.

In an embodiment, the resulting doped polycrystalline silicon layer 112 is an N-type doped polycrystalline silicon layer. It is to be appreciated that the annealing process implemented post implant for dopant activation can have the added benefit of enhancing front side passivation through the above described crystallization process. In such scenarios, there is likely no need for doping during the anneal and, accordingly, the anneal may be performed in an N$_2$ environment. This may allow for double slot loading in a furnace. It is also to be appreciated that, although not depicted, following crystallization to form the doped polycrystalline silicon layer 112, other front side passivation or ARC layers may be formed on the doped polycrystalline silicon layer 112.

Figure 1F:
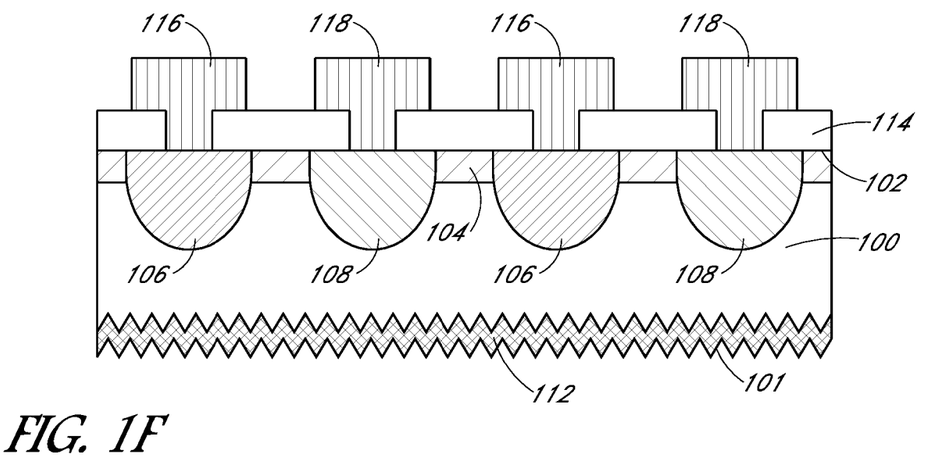
FIG. 1F illustrates a cross-sectional view of the structure of FIG. 1E following formation of a first plurality of contacts electrically connected to the first plurality of dopant regions, and formation of a second plurality of contacts electrically connected to the second plurality of dopant regions.

Referring to FIG. 1F and corresponding optional operation 212 of flowchart 200, the method of fabricating a solar cell further involves forming a first plurality of contacts 116 electrically connected to the first plurality of dopant regions 106, and forming a second plurality of contacts 118 electrically connected to the second plurality of dopant regions 106.

In an embodiment, the contacts are fabricated by first depositing and patterning an insulating layer 114 to have openings and then forming one or more conductive layers in the openings. In an embodiment, the conductive contacts 116 and 118 include metal and are formed by a deposition, lithographic, and etch approach or, alternatively, a printing process.

With respect to a completed or mostly completed solar cell, referring again to FIG. 1F, in accordance with an embodiment of the present disclosure, a solar cell includes a semiconductor substrate 100 having a light-receiving surface 101 and a back surface 102 opposite the light-receiving surface 101. A blanket dopant region 104 is disposed in the semiconductor substrate 100 at the back surface 102 of the semiconductor substrate 100. The blanket dopant region 104 is of a first conductivity type of a first concentration. A first plurality of dopant regions 106 is disposed in the semiconductor substrate 100 and is overlapping with the blanket dopant region 104. The first plurality of dopant regions 106 is of the first conductivity type and of a second, higher, concentration. A second plurality of dopant regions 108 is disposed in the semiconductor substrate 100 and is overlapping with the blanket dopant region 104, but alternating with and not overlapping the first plurality of dopant regions 106. The second plurality of dopant regions 108 is of a second conductivity type of a concentration higher than the first concentration. A first plurality of contacts 116 is electrically connected to the first plurality of dopant regions 106 at the back surface 102 of the solar cell. A second plurality of contacts 118 is electrically connected to the second plurality of dopant regions 108 at the back surface 102 of the solar cell.

In an embodiment, the first conductivity type is P-type (regions 104 and 106), and the second conductivity type is N-type (regions 108). In one such embodiment, the semiconductor substrate 100 is a monocrystalline semiconductor substrate. The first plurality of dopant regions 106 includes boron dopants, and the second plurality of dopant regions 108 includes phosphorous dopants.

In another embodiment, the first conductivity type is N-type (regions 104 and 106), and the second conductivity type is P-type (regions 108). In one such embodiment, the semiconductor substrate 100 is a monocrystalline semiconductor substrate. The first plurality of dopant regions 106 includes phosphorous dopants, and the second plurality of dopant regions 108 includes boron dopants.

In either case, in an embodiment, the first concentration of the first conductivity type is approximately 1E18 atoms/cm$^3$. The second concentration of the first conductivity type is approximately 1E19 atoms/cm$^3$. The concentration of the second conductivity type is approximately 1E19 atoms/cm$^3$.

To further exemplify embodiments of the present disclosure with respect to the process of FIGS. 1A-1F, FIG. 3A illustrates a plan view showing the implant regions of the structure of FIG. 1C. FIG. 3B illustrates a plan view of a mask pattern used to form the diffusion regions described in association with FIGS. 1A and 1B.

Figure 3A:
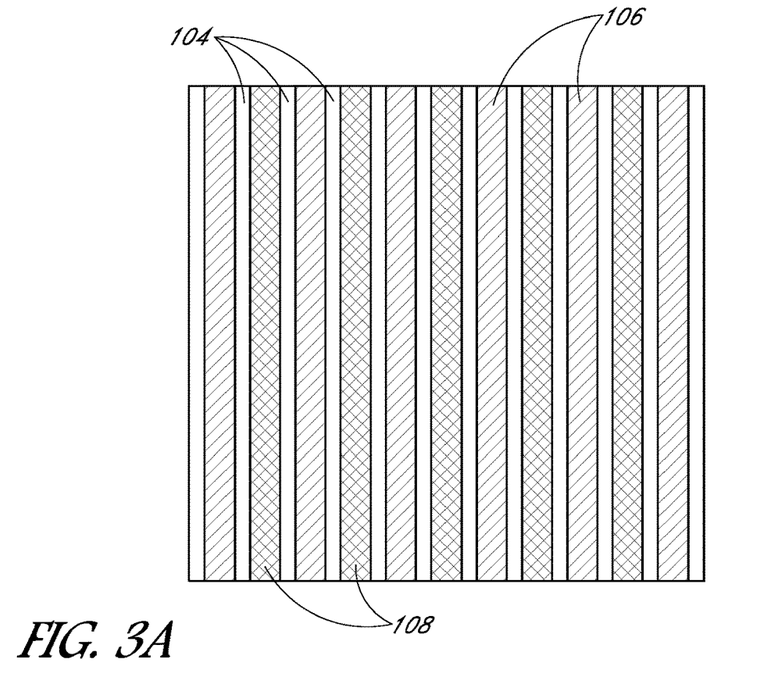
FIG. 3A illustrates a plan view showing the implant regions of the structure of FIG. 1C, in accordance with an embodiment of the present disclosure.
Figure 3B:
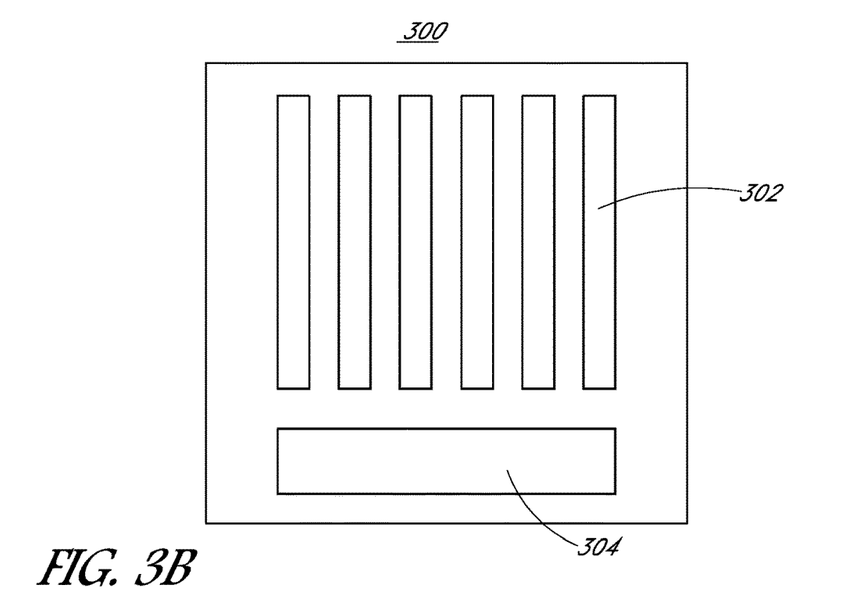
FIG. 3B illustrates a plan view of a mask pattern used to form the diffusion regions described in association with FIGS. 1A and 1B, in accordance with an embodiment of the present disclosure.

Referring to FIG. 3A, the first plurality of dopant regions of the first conductivity type 106 described in association with FIG. 1B alternates with, but does overlap, the second plurality of dopant regions of the second conductivity type 108 described in association with FIG. 1C. Both the first plurality of dopant regions 106 and the second plurality of dopant regions 108 overlap with portions of the lightly doped region of the first conductivity type 104. In an embodiment, the lightly doped region 104 and the first plurality of dopant regions 106 are both formed by implanting dopants during a single pass under a stationary mask in an implanter.

Referring to FIG. 3B, in an embodiment, implanting of the dopants of the first conductivity type to form regions 104 and 106 during the single pass under the stationary mask is performed using a mask 300 having a slit pattern 302 for forming the first plurality of dopant regions 106. A full opening 304 in the mask 300 is for forming the lightly doped region 104. In an embodiment, the mask 300 is a graphite shadow mask for use positioned off of, but in close proximity to, a silicon substrate 100 during implantation.

In another aspect, instead of a blanket pattern for the lightly doped region, a patterned lightly doped region is formed. In an example, FIGS. 4A-4C illustrate cross-sectional views of various stages in the fabrication of a solar cell, in accordance with an embodiment of the present disclosure.

Figure 4A:
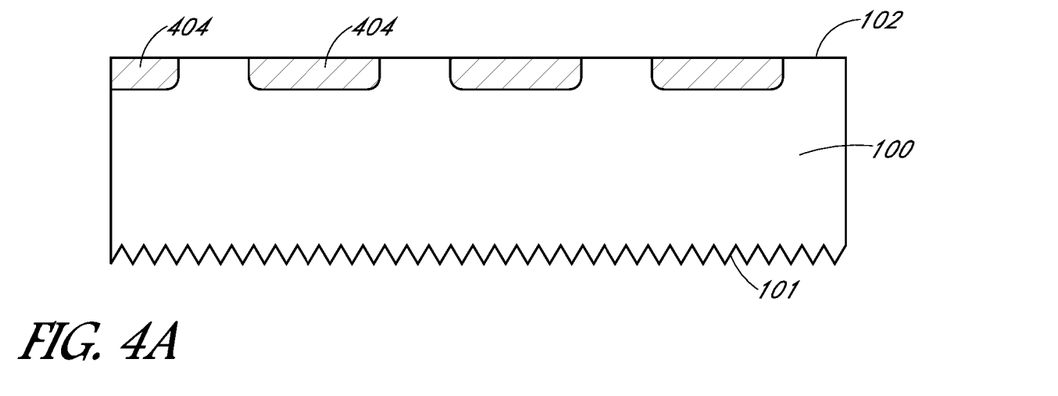
FIG. 4A illustrates a cross-sectional view of illustrates a cross-sectional view following formation of a patterned lightly doped region in a semiconductor substrate by ion implantation.

Referring to FIG. 4A, a method of fabricating a solar cell involves forming a lightly doped region 404 in a semiconductor substrate 100 by ion implantation. The lightly doped region 404 is of a first conductivity type of a first concentration. In an embodiment, the lightly doped region 404 is a pattern of lightly doped regions formed at the back surface 102 in the semiconductor substrate 100, as is depicted in FIG. 4A.

Figure 4B:
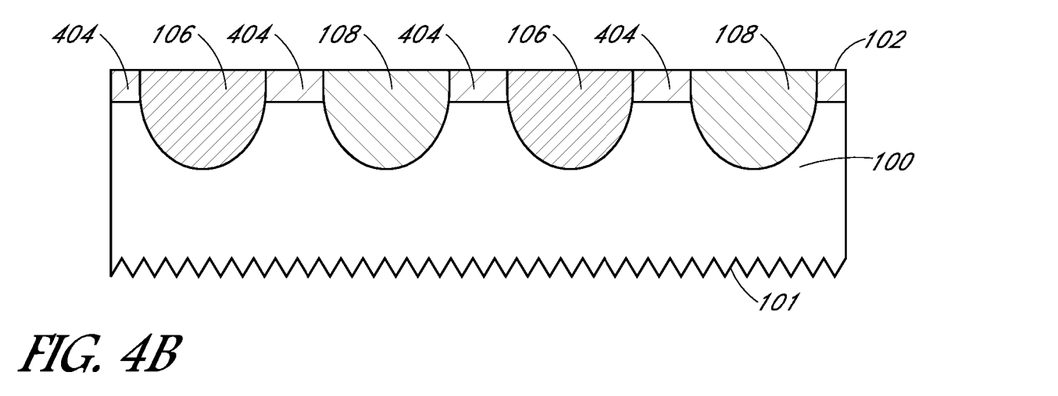
FIG. 4B illustrates a cross-sectional view of illustrates a cross-sectional view of the structure of FIG. 4A following formation of a first plurality of dopant regions of the first conductivity type by ion implantation, and following formation of a second plurality of dopant regions by ion implantation.

Referring to FIG. 4B, the method of fabricating a solar cell further involves forming a first plurality of dopant regions 106 of the first conductivity type by ion implantation. The first plurality of dopant regions 106 of the first conductivity type is of a second, higher, concentration than lightly doped region 404. The first plurality of dopant regions 106 is overlapping with first portions of the lightly doped region 404. A second plurality of dopant regions 108 is also formed by ion implantation. The second plurality of dopant regions 108 is of a second, opposite, conductivity type as compared to the first conductivity type. The second plurality of dopant regions 108 is of a concentration higher than the concentration of the first plurality of dopant regions 106. Furthermore, the second plurality of dopant regions 108 is overlapping with second portions of the lightly doped region 404 and is alternating with, but not overlapping, the first plurality of dopant regions 106.

Figure 4C:
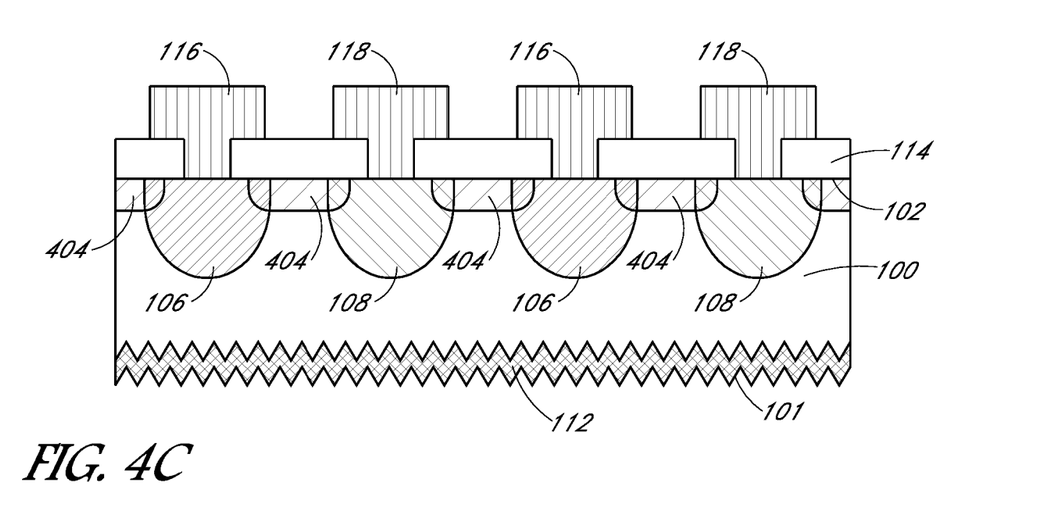
FIG. 4C illustrates a cross-sectional view of the structure of FIG. 4A following formation of a polycrystalline silicon layer on the light-receiving surface of the substrate and following formation of a first plurality of contacts electrically connected to the first plurality of dopant regions, and formation of a second plurality of contacts electrically connected to the second plurality of dopant regions.

Referring to FIG. 4C, the method of fabricating a solar cell further involves forming a doped polycrystalline silicon layer 112 on a light-receiving surface 101 of the semiconductor substrate 100, as was described in association with FIGS. 1D and 1E. Additionally, a first plurality of contacts 116 is electrically connected to the first plurality of dopant regions 106. A second plurality of contacts 118 is electrically connected to the second plurality of dopant regions 106.

With respect to a completed or mostly completed solar cell, referring again to FIG. 4C, in accordance with an embodiment of the present disclosure, a solar cell includes a semiconductor substrate 100 having a light-receiving surface 101 and a back surface 102 opposite the light-receiving surface 101. A patterned dopant region 404 is disposed in the semiconductor substrate 100 at the back surface 102 of the semiconductor substrate 100. The patterned dopant region 404 is of a first conductivity type of a first concentration. A first plurality of dopant regions 106 is disposed in the semiconductor substrate 100 and is contacting at least a portion of the patterned dopant region 404. The first plurality of dopant regions 106 is of the first conductivity type of a second, higher, concentration. A second plurality of dopant regions 108 is disposed in the semiconductor substrate 100 and is contacting at least a portion of the patterned dopant region 404. The second plurality of dopant regions 108 is alternating with and not overlapping the first plurality of dopant regions 106. The second plurality of dopant regions 108 is of a second conductivity type of a concentration higher than the first concentration. A first plurality of contacts 116 is electrically connected to the first plurality of dopant regions 106 at the back surface 102 of the solar cell. A second plurality of contacts 118 is electrically connected to the second plurality of dopant regions 108 at the back surface 102 of the solar cell.

In an embodiment, the first conductivity type is P-type (regions 404 and 106), and the second conductivity type is N-type (regions 108). In one such embodiment, the semiconductor substrate 100 is a monocrystalline semiconductor substrate. The first plurality of dopant regions 106 includes boron dopants, and the second plurality of dopant regions 108 includes phosphorous dopants.

In another embodiment, the first conductivity type is N-type (regions 404 and 106), and the second conductivity type is P-type (regions 108). In one such embodiment, the semiconductor substrate 100 is a monocrystalline semiconductor substrate. The first plurality of dopant regions 106 includes phosphorous dopants, and the second plurality of dopant regions 108 includes boron dopants.

In either case, in an embodiment, the first concentration of the first conductivity type is approximately 1E18 atoms/cm$^3$. The second concentration of the first conductivity type is approximately 1E19 atoms/cm$^3$. The concentration of the second conductivity type is approximately 1E19 atoms/cm$^3$.

To further exemplify embodiments of the present disclosure with respect to the process of FIGS. 4A-4C, FIG. 5A illustrates a plan view showing the implant regions of the structure of FIG. 4B. FIG. 5B illustrates a plan view of a mask pattern used to form the diffusion regions described in association with FIGS. 4A and 4B.

Figure 5A:
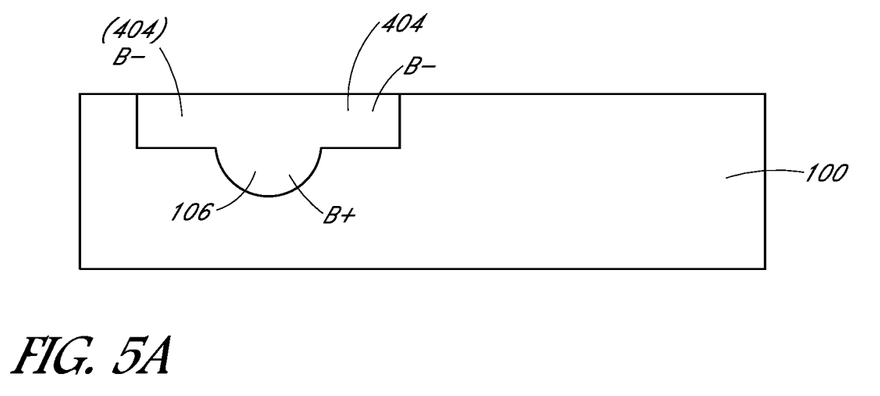
FIG. 5A illustrates a plan view showing the implant regions of the structure of FIG. 4B, in accordance with an embodiment of the present disclosure.
Figure 5B:
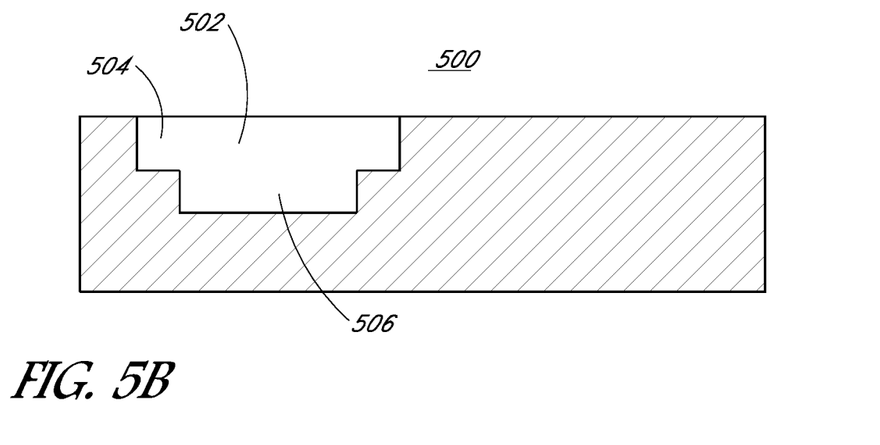
FIG. 5B illustrates a plan view of a mask pattern used to form the diffusion regions described in association with FIGS. 4A and 4B, in accordance with an embodiment of the present disclosure.

Referring to FIG. 5A, the first plurality of dopant regions of the first conductivity type 106 described in association with FIG. 4B overlap with portions of the patterned lightly doped region of the first conductivity type 404. In an embodiment, the lightly doped region 404 (e.g., B$^-$ level doping) and the first plurality of dopant regions 106 (e.g., B$^+$ level doping) are both formed by implanting dopants during a single pass under a stationary mask in an implanter.

Referring to FIG. 5B, in an embodiment, implanting of the dopants of the first conductivity type to form regions 404 and 106 during the single pass under the stationary mask is performed using a mask 500 having an opening 502. The opening 502 has a wide region 504 for forming a region of the pattern of lightly doped regions 404. The opening 502 also has a narrow region 506 for forming the first plurality of dopant regions 106. In an embodiment, the mask 500 is a graphite shadow mask for use positioned off of, but in close proximity to, a silicon substrate 100 during implantation.

In another aspect, with respect again to the process of FIGS. 4A-4C, FIGS. 6A and 6B illustrate plan views of a pair of mask patterns used to form the diffusion regions described in association with FIGS. 4A and 4B, in accordance with another embodiment of the present disclosure.

Figure 6A:
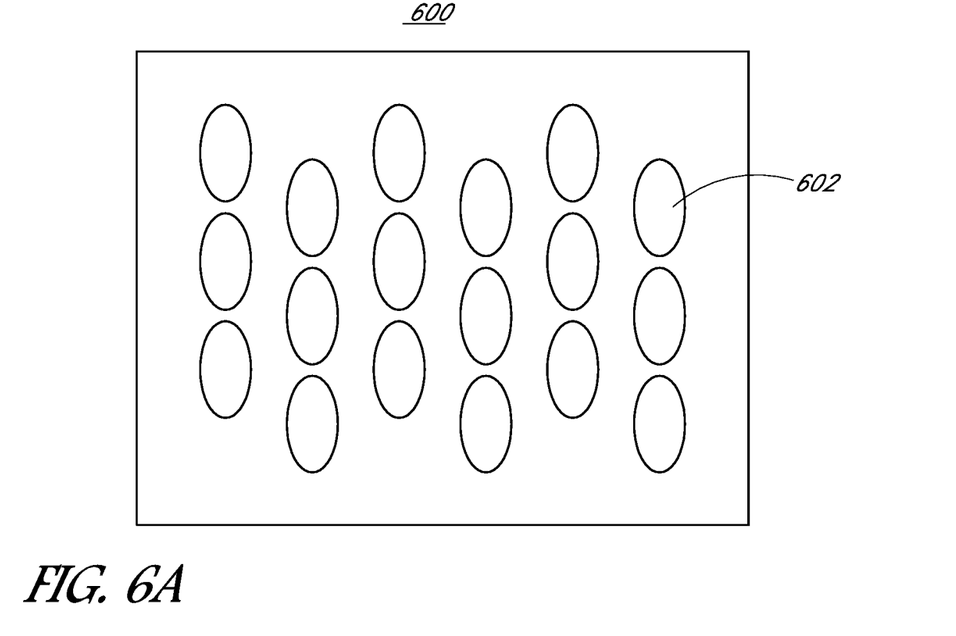
FIGS. 6A and 6B illustrate plan views of a pair of mask patterns used to form the diffusion regions described in association with FIGS. 4A and 4B, in accordance with another embodiment of the present disclosure.
Figure 6B:
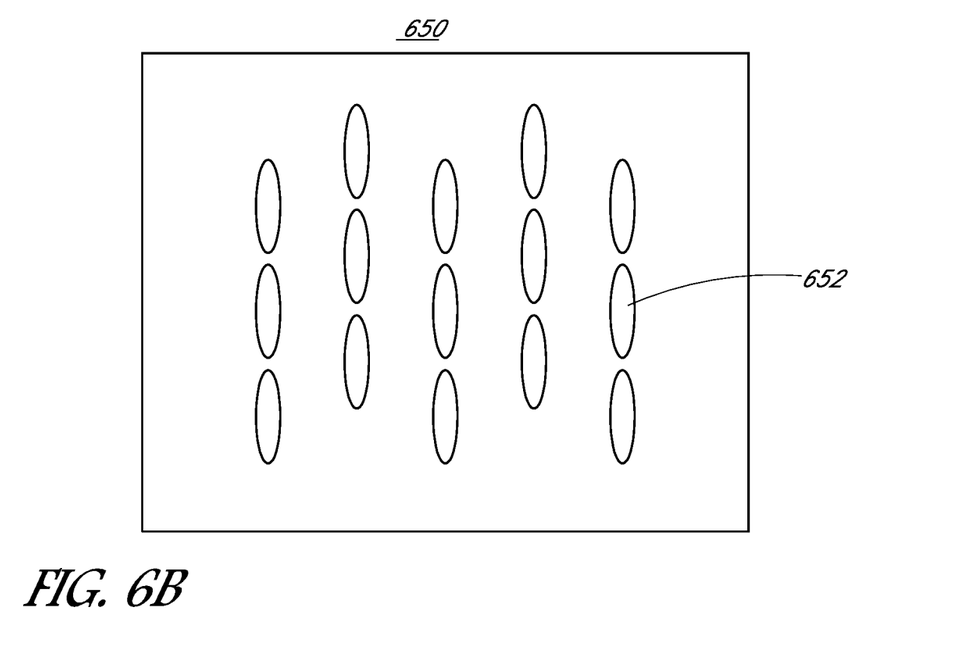

Referring to FIG. 6A, in an embodiment, implanting of the dopants of the first conductivity type to form regions 404 and 106 of FIG. 4B during a single pass under a stationary mask is performed using a mask 600 having openings 602. Referring to FIG. 6B, implanting of the dopants of the second conductivity type to form regions 108 of FIG. 4b under a stationary mask is performed using a mask 650 having openings 652. The openings 602 of the mask 600 are substantially wider than the openings 652 of the mask 650. In an embodiment, the masks 600 and 650 are graphite shadow masks for use positioned off of, but in close proximity to, a silicon substrate 100 during implantation.

Figure 7:
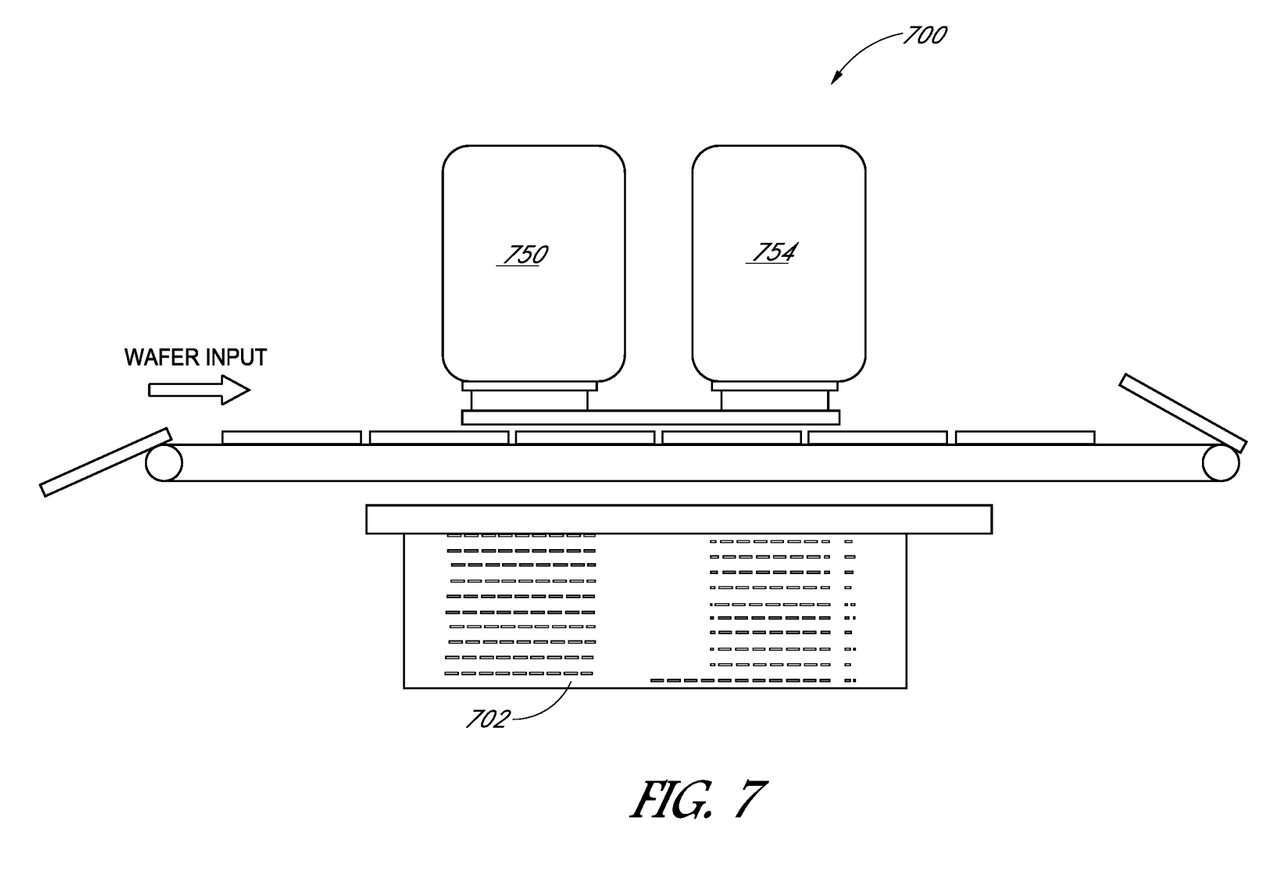
FIG. 7 schematically illustrates a cross-sectional view of an inline platform for patterned implant involving a traveling wafer and stationary shadow mask, in accordance with an embodiment of the present disclosure.

In another aspect, FIG. 7 schematically illustrates a cross-sectional view of an inline platform for patterned implant involving a traveling wafer and stationary shadow mask, in accordance with an embodiment of the present disclosure.

Referring to FIG. 7, an inline platform 700 includes a wafer input region for an input wafer. A first station 750 is configured to implant dopant impurity atoms of a first conductivity type through a first shadow mask and into a substrate. A second station 754 is configured to implant dopant impurity atoms of a second, different, conductivity type through a second shadow mask into the substrate. In a particular embodiment, the first station 750 is configured to implant boron atoms or ions, and the second station 754 is configured to implant phosphorous atoms or ions.

Referring again to FIG. 7, a stationary stencil mask 702, such as a stationary graphite mask, is held in proximity to, but not in contact with, the substrate during implantation. Although shown as one mask with two corresponding slit patterns, it is to be appreciated that an individual shadow mask will typically be used for each of the modules 750 and 754. The usable distance for spacing from the receiving substrate may be determined by the degree to which the ion beam can be collimated. A typical spacing may be between 50-250 microns which is roughly the same order of thickness as a Si solar wafer substrate. However, the spacing may be as high a 1000 microns (1 mm) under conditions which minimize the angle of divergence (from vertical) below the lower edge of the shadow mask. In an embodiment, the resulting pattern of implanted regions is a one-dimensional interdigitated finger pattern.

In an embodiment, as described above, a stencil mask such as a stationary graphite shadow mask may be used for implantation. As an example, FIG. 7 schematically illustrates a possible inline platform for patterned implant involving stationary shadow masks, in accordance with an embodiment of the present disclosure. In either of the above described cases, in an embodiment, some deposition or residue accumulation may occur on the stencil masks. After numerous runs, such deposition or accumulation may require removal from the masks. It is to be appreciated that an optimal number of runs may be determined to balance throughput against an over-accumulation of material on the stencil mask that could in some way impact later implantation processes. In one such embodiment, after a certain number of runs, the accumulated material is removed by selective etching, and the stencil mask can then be reused.

Figure 8:
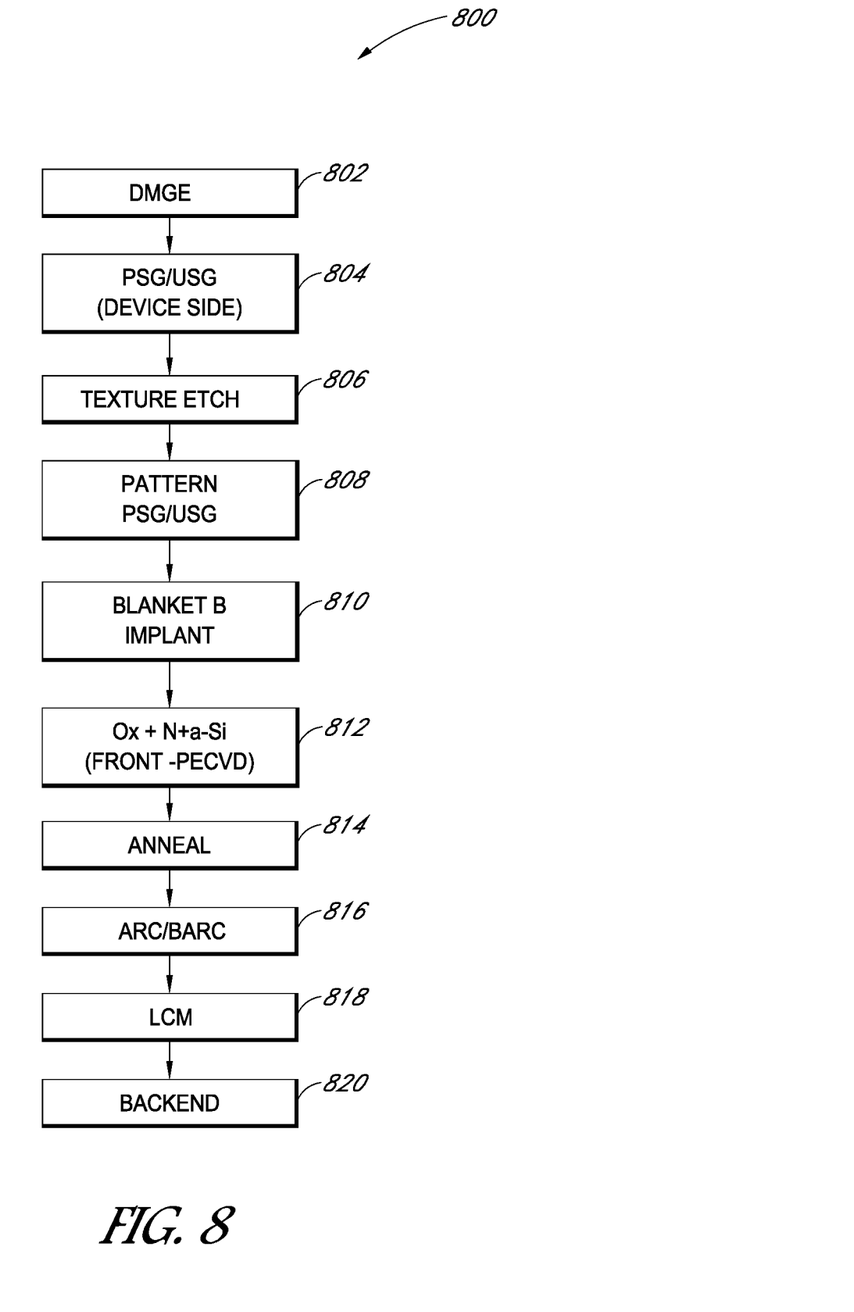
FIG. 8 is a flowchart listing operations in another method of fabricating a solar cell, in accordance with an embodiment of the present disclosure.

Referring again to the process flows described in association with FIGS. 1A-1F and 4A-4C, in an embodiment, two boron doses are performed in one pass using a stationary mask that has a full wafer opening to create a blanket lightly doped region followed by a slit pattern to provide selective emitter regions. It is to be appreciated that other processing schemes may benefit from direct implant of a back surface of a substrate of a solar cell. As an example, FIG. 8 is a flowchart 800 listing operations in another method of fabricating a solar cell, in accordance with an embodiment of the present disclosure.

Referring to operation 802 of flowchart 800, a pre-etched silicon wafer is received, or reduced step wet etch process is performed. Phosphorous silica glass (PSG) and undoped silica glass (USG) layers are then deposited on the device side (e.g., substrate back side) at operation 804. Referring to operation 806, a texturizing etch is performed for exposed light-receiving surfaces. The PSG/USG layers are then patterned at operation 808. Referring to operation 810, boron is implanted in a blanket (non-patterned) manner at the device side. Front side treatments such as oxidation (Ox), nitridation (N) and PECVD deposition of amorphous silicon (a-Si) are then performed at operation 812. Referring to operation 814, an anneal is performed. Anti-reflective coating (ARC) and bottom anti-reflective coating (BARC) layers are then formed on the device side at operation 816. Referring to operation 818, lower contact metallization is then performed. Backend process is then completed at operation 820 of flowchart 800.

With reference again to the process flow described in association with flowchart 800, the process does not require patterned ion implant capability. Instead, a patterned solid state N-type dopant (phosphorous) source is first formed. The patterned solid state N-type dopant source is then used as a mask for a blanket boron implant operation. Thus, a medium-low dose blanket boron implant operation can be implemented for P-type emitter region fabrication.

Thus, the introduction of high throughput ion implant tools targeting high efficiency solar applications with patterning capabilities may be applicable to the fabrication of interdigitated back contact (IBC) solar cells. Overall, although certain materials are described specifically above, some materials may be readily substituted with others with other such embodiments remaining within the spirit and scope of embodiments of the present disclosure. For example, in an embodiment, a different material substrate, such as a group III-V material substrate, can be used instead of a silicon substrate. In another embodiment, a polycrystalline or multi-crystalline silicon substrate is used. Furthermore, it is to be understood that, where the ordering of N+ and then P+ type doping is described specifically for emitter regions on a back surface of a solar cell, other embodiments contemplated include the opposite ordering of conductivity type, e.g., P+ and then N+ type doping, respectively. Additionally, although reference is made significantly to back contact solar cell arrangements, it is to be appreciated that approaches described herein may have application to front contact solar cells as well. In general, embodiments described herein may be implemented to provide lower cost, high throughput ion implant platforms for the fabrication of high efficiency interdigitated back contact (IBC)-type solar cells.

Thus, methods of fabricating solar cell emitter regions using substrate-level ion implantation, and the resulting solar cells, have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
    forming a lightly doped region in a semiconductor substrate by a first ion implantation, the lightly doped region of a first conductivity type of a first concentration;
    forming a first plurality of dopant regions of the first conductivity type of a second, higher, concentration by a second ion implantation, the first plurality of dopant regions overlapping with a first portion of the lightly doped region;
    forming a second plurality of dopant regions by a third ion implantation, the second plurality of dopant regions having a second conductivity type of a concentration higher than the first concentration, and the second plurality of dopant regions overlapping with a second portion of the lightly doped region and alternating with but not overlapping the first plurality of dopant regions;
    thermally annealing the semiconductor substrate subsequent to the third ion implantation;
    forming a tunneling dielectric layer on a light-receiving surface of the semiconductor substrate;
    forming a doped amorphous silicon layer on the tunneling dielectric layer on the light-receiving surface of the semiconductor substrate prior to the thermally annealing the semiconductor substrate; and
    crystallizing the doped amorphous silicon layer during the thermally annealing the semiconductor substrate to form a doped polycrystalline silicon layer on the light-receiving surface of the semiconductor substrate.

2. The method of claim 1, wherein forming the lightly doped region and forming the first plurality of dopant regions comprises implanting dopants during a single pass under a stationary mask in an implanter.

3. The method of claim 2, wherein implanting dopants during the single pass under the stationary mask comprises using a mask having a slit pattern for forming the first plurality of dopant regions and a full opening for forming the lightly doped region.

4. The method of claim 1, wherein the thermally annealing the semiconductor substrate comprises thermally annealing the semiconductor in an atmosphere substantially comprising nitrogen (N2).

5. The method of claim 1, wherein forming the lightly doped region comprises forming a blanket lightly doped region in the semiconductor substrate.

6. The method of claim 1, wherein forming the lightly doped region comprises forming patterned lightly doped regions in the semiconductor substrate.

7. The method of claim 1, further comprising:
    forming a first plurality of contacts electrically connected to the first plurality of dopant regions; and
    forming a second plurality of contacts electrically connected to the second plurality of dopant regions.

8. A method of fabricating a solar cell, the method comprising:
    forming a lightly doped region in a back surface of the semiconductor substrate by ion implantation, the lightly doped region of a first conductivity type of a first concentration, wherein the back surface is opposite a light-receiving surface of the semiconductor substrate;
    forming a first plurality of dopant regions of the first conductivity type of a second, higher, concentration by ion implantation, the first plurality of dopant regions overlapping with a first portion of the lightly doped region;
    forming a second plurality of dopant regions by ion implantation, the second plurality of dopant regions having a second conductivity type of a concentration higher than the first concentration, and the second plurality of dopant regions overlapping with a second portion of the lightly doped region and alternating with but not overlapping the first plurality of dopant regions;
    forming a tunneling dielectric layer on a light-receiving surface of the semiconductor substrate;
    forming a doped amorphous silicon layer on the tunneling dielectric layer on the light-receiving surface of the semiconductor substrate prior to the thermally annealing the semiconductor substrate; and
    crystallizing the doped amorphous silicon layer during the thermally annealing the semiconductor substrate to form a doped polycrystalline silicon layer on the light-receiving surface of the semiconductor substrate.

9. The method of claim 8, wherein forming the lightly doped region and forming the first plurality of dopant regions comprises implanting dopants during a single pass under a stationary mask in an implanter.

10. The method of claim 9, wherein implanting dopants during the single pass under the stationary mask comprises using a mask having a slit pattern for forming the first plurality of dopant regions and a full opening for forming the lightly doped region.

11. The method of claim 8, further comprising:
    thermally annealing the semiconductor substrate subsequent to the forming the second plurality of dopant regions by ion implantation.

12. The method of claim 11, wherein the thermally annealing the semiconductor substrate comprises thermally annealing the semiconductor in an atmosphere substantially comprising nitrogen (N2).

13. The method of claim 8, wherein forming the lightly doped region comprises forming a blanket lightly doped region in the semiconductor substrate.

14. The method of claim 8, wherein forming the lightly doped region comprises forming patterned lightly doped regions in the semiconductor substrate.

15. The method of claim 8, further comprising:
forming a first plurality of contacts electrically connected to the first plurality of dopant regions; and
forming a second plurality of contacts electrically connected to the second plurality of dopant regions.

16. The method of claim 8, wherein the first conductivity type is P-type.

17. The method of claim 8, wherein the second conductivity type is N-type.

18. The method of claim 8, wherein forming the doped amorphous silicon layer comprises using plasma enhanced chemical vapor deposition to form the doped amorphous silicon layer.

* * * * *